(12) United States Patent
Erickson et al.

(10) Patent No.: US 10,598,710 B2
(45) Date of Patent: Mar. 24, 2020

(54) COGNITIVE ANALYSIS USING APPLIED ANALOG CIRCUITS

(71) Applicant: International Business Machines Corporation, Armonk, NY (US)

(72) Inventors: Karl R. Erickson, Rochester, MN (US); Phil C. Paone, Rochester, MN (US); George F. Paulik, Rochester, MN (US); David P. Paulsen, Inver Grove Heights, MN (US); Raymond A. Richetta, Rochester, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 15/612,360

(22) Filed: Jun. 2, 2017

(65) Prior Publication Data

US 2018/0348271 A1    Dec. 6, 2018

(51) Int. Cl.
*G01R 27/26* (2006.01)
*G06N 5/02* (2006.01)
*G06G 7/14* (2006.01)
*G06F 17/18* (2006.01)

(52) U.S. Cl.
CPC .......... *G01R 27/2605* (2013.01); *G06G 7/14* (2013.01); *G06N 5/02* (2013.01); *G06F 17/18* (2013.01)

(58) Field of Classification Search
CPC ........ G01R 27/2605; G01G 7/14; G06N 5/02; G06F 17/18
See application file for complete search history.

(56) References Cited

U.S. PATENT DOCUMENTS

| | | |
|---|---|---|
| 3,076,933 A | 2/1963 | Negrete |
| 4,561,089 A | 12/1985 | Rouse et al. |
| 4,800,518 A | 1/1989 | Miller |
| 4,802,103 A | 1/1989 | Faggin et al. |
| 4,896,156 A | 1/1990 | Garverick |
| 5,376,915 A | 12/1994 | Takeuchi et al. |
| 5,497,121 A | 3/1996 | D'Hont |
| 5,768,501 A | 6/1998 | Lewis |

(Continued)

OTHER PUBLICATIONS

Appendix P; List of IBM Patent or Applications Treated as Related, Jun. 8, 2017, 2 pages.

(Continued)

*Primary Examiner* — Elias Desta
(74) *Attorney, Agent, or Firm* — Nathan M. Rau

(57) ABSTRACT

Cognitive analysis using applied analog circuits including receiving, by a circuit, a first set of data results and a second set of data results; charging a first capacitor on the circuit with a first unit of charge for each of the first set of data results that indicates a positive data point; charging a second capacitor on the circuit with a second unit of charge for each of the second set of data results that indicates a positive data point; applying a charge from the first capacitor and a charge from the second capacitor to an analog unit of the circuit; and generating a signal on a circuit output indicating that a ratio of the positive data points in the first set of data results to the positive data points in the second set of data results is greater than a statistical significance.

13 Claims, 6 Drawing Sheets

(56) References Cited

U.S. PATENT DOCUMENTS

| | | | |
|---|---|---|---|
| 6,081,468 | A | 6/2000 | Taira et al. |
| 6,130,568 | A | 10/2000 | Kwon et al. |
| 6,154,864 | A | 11/2000 | Merritt |
| 6,982,431 | B2 | 1/2006 | Modlin et al. |
| 7,084,695 | B2 | 8/2006 | Porter |
| 7,111,260 | B2 | 9/2006 | Visweswariah |
| 7,139,743 | B2 | 11/2006 | Indeck et al. |
| 8,909,592 | B2 | 12/2014 | Stergiou et al. |
| 9,000,837 | B1 | 4/2015 | Fifield |
| 9,082,495 | B2 | 7/2015 | Lee et al. |
| 9,093,175 | B2 | 7/2015 | Barth, Jr. et al. |
| 9,147,144 | B2 | 9/2015 | Potyrailo et al. |
| 9,147,457 | B2 | 9/2015 | Kim et al. |
| 9,367,853 | B2 | 6/2016 | Cronin et al. |
| 9,411,009 | B1 | 8/2016 | Aguayo Gonzalez et al. |
| 9,478,303 | B1 | 10/2016 | Parker |
| 9,508,424 | B2 | 11/2016 | Lee |
| 9,916,538 | B2 * | 3/2018 | Zadeh .................... G06N 7/005 |
| 9,916,890 | B1 | 3/2018 | Erickson et al. |
| 10,037,792 | B1 | 7/2018 | Erickson et al. |
| 10,043,568 | B1 | 8/2018 | Erickson et al. |
| 10,304,522 | B2 | 5/2019 | Erickson et al. |
| 10,418,094 | B2 | 9/2019 | Erickson et al. |
| 2002/0159319 | A1 | 10/2002 | Kirihata et al. |
| 2006/0062483 | A1 | 3/2006 | Kondo et al. |
| 2007/0070754 | A1 | 3/2007 | Vogelsang |
| 2008/0313510 | A1 | 12/2008 | Baker |
| 2010/0182859 | A1 | 7/2010 | Kohler et al. |
| 2013/0090706 | A1 * | 4/2013 | Nudo ................ A61N 1/36103 607/62 |
| 2014/0063915 | A1 | 3/2014 | Cronie et al. |
| 2014/0122925 | A1 | 5/2014 | Peake et al. |
| 2014/0160832 | A1 | 6/2014 | Ito |
| 2014/0201426 | A1 | 7/2014 | Ma |
| 2014/0293715 | A1 | 10/2014 | Barth, Jr. et al. |
| 2015/0016193 | A1 | 1/2015 | Lewis et al. |
| 2015/0281612 | A1 | 10/2015 | Lund et al. |
| 2015/0358090 | A1 | 12/2015 | Mactaggart |
| 2017/0220918 | A1 | 8/2017 | Entner |
| 2018/0218766 | A1 | 8/2018 | Erickson et al. |
| 2018/0240512 | A1 | 8/2018 | Erickson et al. |
| 2018/0348272 | A1 | 12/2018 | Erickson et al. |
| 2018/0348273 | A1 | 12/2018 | Erickson et al. |
| 2018/0348274 | A1 | 12/2018 | Erickson et al. |
| 2018/0349774 | A1 | 12/2018 | Erickson et al. |
| 2018/0349775 | A1 | 12/2018 | Erickson et al. |
| 2018/0350422 | A1 | 12/2018 | Erickson et al. |
| 2018/0350423 | A1 | 12/2018 | Erickson et al. |

OTHER PUBLICATIONS

Carstens, *Open Bit Line Sensing: Writing Dummy Cells for Test Purpose*, An IP.com Prior Art Database Technical Disclosure, IP.com No. IPCOM000174809D, Qimonda 2008, Original Publication Date: Oct. 13, 2008, 2 pages.

U.S. Appl. No. 16/000,207, to to Karl R. Erickson et al., entitled, *Optimizing Data Approximation Analysis Using Low Power Circuitry*, assigned to International Business Machines Corporation, 34 pages, filed Jun. 5, 2018.

U.S. Appl. No. 16/001,420, to to Karl R. Erickson et al., entitled, *Optimizing Data Approximation Analysis Using Low Power Circuitry*, assigned to International Business Machines Corporation, 34 pages, filed Jun. 6, 2018.

Appendix P; List of IBM Patent or Applications Treated as Related, Sep. 14, 2018, 2 pages.

U.S. Appl. No. 15/892,037, to Karl R. Erickson et al., entitled, *Predicting Data Correlation Using Multivalued Logical Outputs in Static Random Access Memory (SRAM) Storage Cells*, assigned to International Business Machines Corporation, 24 pages, filed Feb. 28, 2018.

U.S. Appl. No. 15/822,479, to Karl R. Erickson et al., entitled, *Optimizing Data Approximation Analysis Using Low Power Circuitry*, assigned to International Business Machines Corporation, 28 pages, filed Nov. 27, 2017.

U.S. Appl. No. 15/820,301, to Karl R. Erickson et al., entitled, *Real Time Cognitive Monitoring of Correlations Between Variables*, assigned to International Business Machines Corporation, 34 pages, filed Nov. 21, 2017.

U.S. Appl. No. 15/818,929, to Karl R. Erickson et al., entitled, *Cognitive Analysis Using Applied Analog Circuits*, assigned to International Business Machines Corporation, 31 pages, filed Nov. 21, 2017.

U.S. Appl. No. 15/818,977, to Karl R. Erickson et al., entitled, *Real Time Cognitive Reasoning Using a Circuit With Varying Confidence Level Alerts*, assigned to International Business Machines Corporation, 36 pages, filed Nov. 21, 2017.

Appendix P; List of Patents or Applications Treated as Related, Feb. 27, 2018, 2 pages.

U.S. Appl. No. 15/437,482, to Karl R. Erickson et al., entitled, *Predicting Data Correlation Using Multivalued Logical Outputs in Static Random Access Memory (SRAM) Storage Cells*, assigned to International Business Machines Corporation, 29 pages, filed Feb. 21, 2017.

U.S. Appl. No. 15/420,679, to Karl R. Erickson et al., entitled, *Big Data Analysis Using Low Power Circuit Design*, assigned to International Business Machines Corporation, 31 pages, filed Jan. 31, 2017.

U.S. Appl. No. 15/612,272, to to Karl R. Erickson et al., entitled, *Real Time Cognitive Reasoning Using a Circuit With Varying Confidence Level Alerts*, assigned to International Business Machines Corporation, 41 pages, filed Jun. 2, 2017.

U.S. Appl. No. 15/612,433, to to Karl R. Erickson et al., entitled, *Real Time Cognitive Monitoring of Correlations Between Variables*, assigned to International Business Machines Corporation, 41 pages, filed Jun. 2, 2017.

U.S. Appl. No. 15/612,316, to to Karl R. Erickson et al., entitled, *Optimizing Data Approximation Analysis Using Low Power Circuitry*, assigned to International Business Machines Corporation, 34 pages, filed Jun. 2, 2017.

*Voltage Comparator, Chapter 6—Analog Integrated Circuits*, All About Circuits, Electronics Textbook, <https://www.allaboutcircuits.com/textbook/experiments/chpt-6/voltage-comparator/>, EETech Media, LLC, printed Mar. 10, 2017, 3 pages.

Kozma et al., *A Low-Power Current-Mode Correlation Detector with Analog Data Storage*, 2004 IEEE Region 10 Conference (TENCON 2004), Nov. 2004, vol. 2, pp. 442-445, IEEE Xplore Digital Library (ieee.org) online, DOI: 10.1109/TENCON.2004.1414627, URL: ieeexplore.ieee.org/abstract/document/1414627/.

* cited by examiner

COGNITIVE ANALYSIS USING APPLIED ANALOG CIRCUITS

BACKGROUND

Field of the Invention

The field of the invention is data processing, or, more specifically, methods, apparatus, and products for cognitive analysis using applied analog circuits.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for cognitive analysis using applied analog circuits are disclosed in this specification. Cognitive analysis using applied analog circuits includes receiving, by a circuit, a first set of data results and a second set of data results, wherein each set of data results comprises binary data points; charging a first capacitor on the circuit with a first unit of charge for each of the first set of data results that indicates a positive data point; charging a second capacitor on the circuit with a second unit of charge for each of the second set of data results that indicates a positive data point; applying a charge from the first capacitor and a charge from the second capacitor to an analog unit of the circuit, wherein the analog unit generates a signal on an analog unit output indicating a difference between the charge on the first capacitor and the charge on the second capacitor; determining, by the circuit based on an output of the analog unit, that the difference between the charge on the first capacitor and the charge on the second capacitor is greater than a statistically significant threshold number of units of charge; and generating a signal on a circuit output indicating that a ratio of the positive data points in the first set of data results to the positive data points in the second set of data results is greater than a statistical significance.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
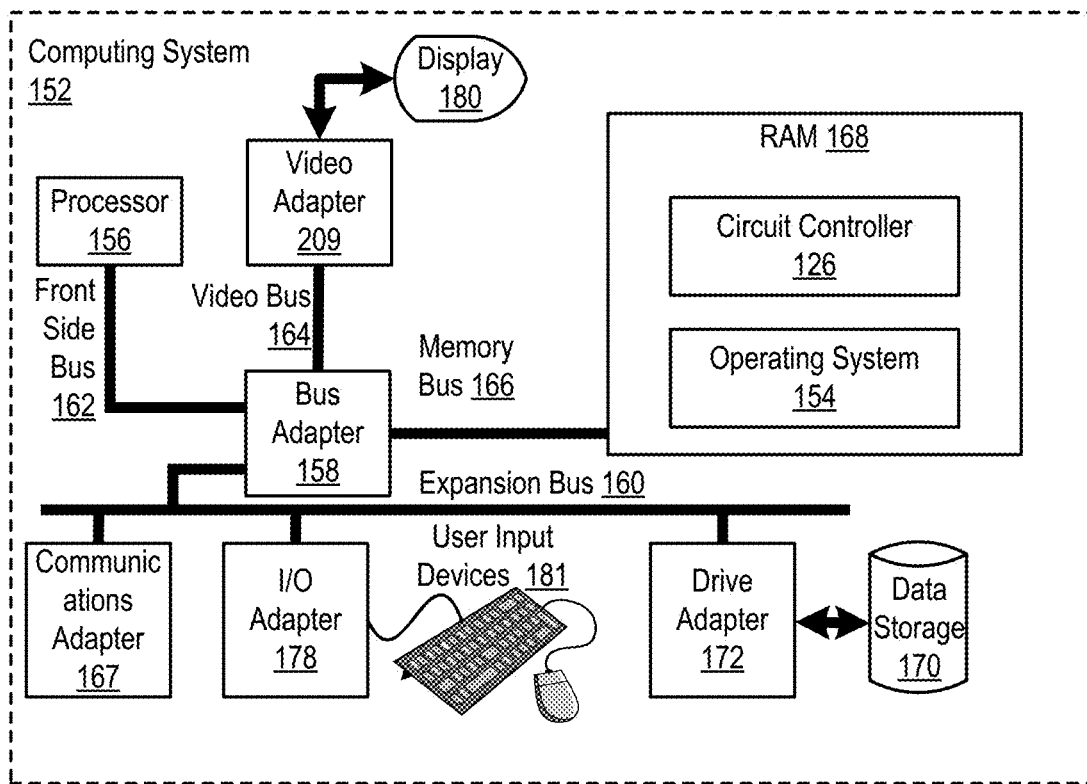
FIG. 1 sets forth a block diagram of an example system configured for cognitive analysis using applied analog circuits according to embodiments of the present invention.

Exemplary methods, apparatus, and products for cognitive analysis using applied analog circuits in accordance with the present invention are described with reference to the accompanying drawings, beginning with FIG. 1. FIG. 1 sets forth a block diagram of automated computing machinery comprising an exemplary computing system (152) configured for cognitive analysis using applied analog circuits according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for cognitive analysis using applied analog circuits according to embodiments of the present invention include UNIX™, Linux™, Microsoft XP™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a circuit controller (126), a module of computer program instructions for cognitive analysis using applied analog circuits.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for cognitive analysis using applied analog circuits according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152)

of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for cognitive analysis using applied analog circuits according to embodiments of the present invention include modems for wired dial-up communications, Ethernet (IEEE 802.3) adapters for wired data communications, and 802.11 adapters for wireless data communications.

Figure 2:
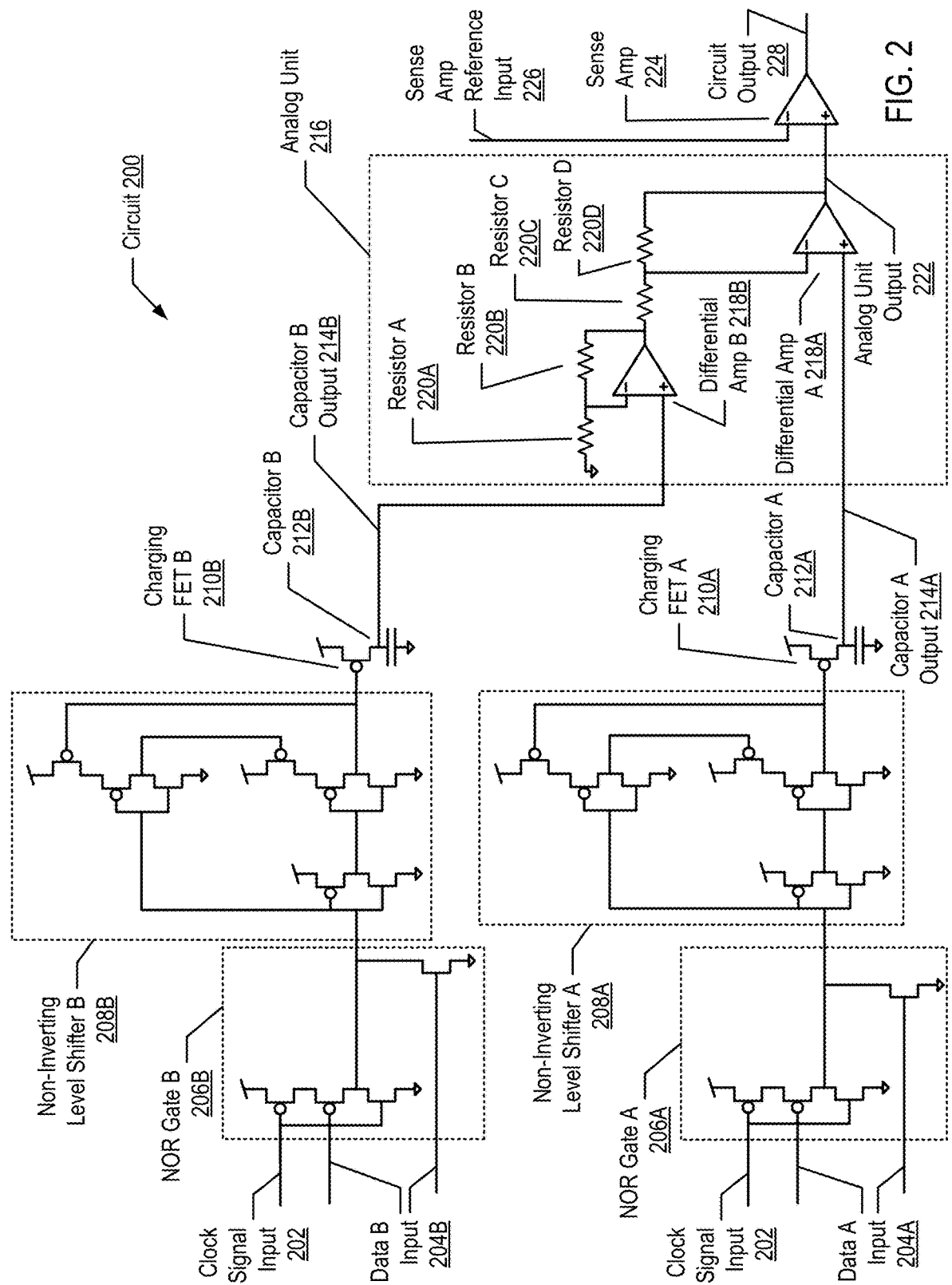
FIG. 2 sets forth an example circuit configured for cognitive analysis using applied analog circuits according to embodiments of the present invention.

FIG. 2 shows elements of an example circuit (200) configured for cognitive analysis using applied analog circuits in accordance with the present invention. As shown in FIG. 2, the exemplary circuit (200) includes clock signal inputs (202), data A input (204A), data B input (204B), NOR gate A (206A), NOR gate B (206B), non-inverting level shifter A (208A), non-inverting level shifter B (208B), charging field effect transistor (FET) A (210A), charging FET B (210B), capacitor A (212A), capacitor B (212B), capacitor A output (214A), capacitor B output (214B), an analog unit (216) which includes two differential amplifiers (amps) (differential amp A (218A), differential amp B (218B)), four resistors (resistor A (220A), resistor B (220B), resistor C (220C), resistor D (220D)), and an analog unit output (222), a sense amp (224), a sense amp reference input (226), and a circuit output (228).

The example circuit, in general, may be configured to receive two sets of binary data via data A input (204A) and data B input (204B). For each positive data point (i.e., '1's or high bits) in each set of data, a unit of charge is placed on the corresponding capacitor (capacitor A (212A), capacitor B (212B)), resulting in a charge on each capacitor that corresponds to the number of positive data points in each data set. The charges on each capacitor (capacitor A (212A), capacitor B (212B)) are then applied, via the capacitor outputs (capacitor A output (214A), capacitor B output (214B)), to the analog unit (216). The analog unit (216) generates an output on the analog unit output (222) that is the difference (or multiple of the difference) between the charge on the capacitor A output (214A) and the charge on the capacitor B output (214B). The analog unit output (222) is compared by a sense amp (224) to a sense amp reference input (226) to determine whether the difference exceeds a statistically significant threshold number of units of charge. If the threshold is exceeded, a signal is generated on the circuit output (228) indicating that the positive data points applied to the data A input (204A) are greater than the positive data points applied to the data B input (204B) to a statistical significance.

The circuit (200) performs the above evaluation in a low-latency, low power manner. The circuit (200) may be useful for circumstances requiring real-time or near real-time analysis and comparison of two sets of data results. Such low-latency, low power evaluation of the sets of data results allows a system to quickly and efficiently address anomalies in the data results. For example, results of tests performed on manufactured items may be evaluated to determine the frequency of failures. The circuit (200) may be used to determine, at or near the time of testing, whether one failure condition occurs more frequently than another failure condition. Based on the evaluation, adjustments can be made to the manufacturing process to address the anomaly.

The clock signal inputs (202) are pins or other input wires configured to receive a timed clock pulse as one input into the NOR gates (NOR gate A (206A), NOR gate B (206B)). The data inputs (data A input (204A), data B input (204B)) are pins or other input wires configured to receive signals corresponding to the data bits in the set of data results, such as signals corresponding to a positive data point, and a signal corresponding to a negative data point. A high bit on the data input will pull up the clock signal input, and a low bit on the data input will pull down the clock signal input. The data bits may be received as voltages corresponding to high data bits and low data bits. Further, the set of data results may be a very large data set comprising hundreds, thousands, or millions of data bits in a very short time period. Each data bit in the set of data results may represent a result in the form of a high bit (positive) or a low bit (negative). Each set of data results may be applied to the data inputs (data A input (204A), data B input (204B)) by a circuit controller.

The non-inverting level shifters (non-inverting level shifter A (208A), non-inverting level shifter B (208B)) receive the pulse from the NOR gates (NOR gate A (206A), NOR gate B (206B)), uplift the voltage of the pulse, and apply the pulse to the charging FETs (charging FET A (210A), charging FET B (210B)). Each pulse received from the NOR gates (NOR gate A (206A), NOR gate B (206B)) indicating a high bit is adjusted to have the same magnitude as all other pulses. The non-inverting level shifters (non-inverting level shifter A (208A), non-inverting level shifter B (208B)) may increase the voltage (for example, from 0.7V to 1.5V) resulting in a greater linear region within the capacitor for storing units of charge.

The charging FETs (charging FET A (210A), charging FET B (210B)) are configured to put a unit of charge onto the capacitors (capacitor A (212A), capacitor B (212B)) for each clocked-timed pulse received from the non-inverting level shifters (non-inverting level shifter A (208A), non-inverting level shifter B (208B)). The capacitors (capacitor A (212A), capacitor B (212B)) receive units of charge from the charging FETs (charging FET A (210A), charging FET B (210B)) and store the resulting total charge. The resulting capacitor output charge is placed on the capacitor outputs (capacitor A output (214A), capacitor B output (214B)). The unit of charge placed on the capacitors (capacitor A (212A), capacitor B (212B)) for each '1' received in the set of data may be altered by changing the length of the clock pulse. The charging FETs (charging FET A (210A), charging FET B (210B)) may be p-channel FETs.

Each capacitor (capacitor A (212A), capacitor B (212B)) may be provided a baseline charge prior to receiving the units of charge resulting from the corresponding sets of data results. The baseline charge may be placed on the capacitors to ensure that an output is triggered in the event of a very low number of units of charge.

The capacitor outputs (capacitor A output (214A), capacitor B output (214B)) are coupled to the differential amps (differential amp A (218A), differential amp B (218B)) within the analog unit (216). The analog unit (216) is circuitry configured for low power, low latency data signal analysis. The analog unit (216) receives the charge from capacitor A (212A) and the charge from capacitor B (212B) and generates a signal on the analog unit output (222) that indicates the difference (or a multiple of the difference) between the charge on the capacitor A (212A) and the charge on the capacitor B (212B). The analog unit may include any analog circuitry configured to receive and generate continuously variable analog signals.

The example analog unit (216) within the circuit (200) includes two differential amps (differential amp A (218A), differential amp B (218B)). Each differential amp (differential amp A (218A), differential amp B (218B)) receives an input from one of the capacitor outputs (capacitor A output (214A), capacitor B output (214B)) and one input from a feedback loop. The example analog unit (216) within the circuit (200) also includes four resistors (resistor A (220A), resistor B (220B), resistor C (220C), resistor D (220D)). Obtaining a voltage on the analog unit output (222) that is a multiple of the voltage on capacitor A output (214A) minus the voltage on capacitor B output (214B) using four equivalent, or nearly equivalent, resistors is demonstrated in the following equations:

$$V_{R2} = \left(\frac{R_2}{R_1}\right)V_1$$

$$V_X = V_1 + V_{R2} = V_1 + \left(\frac{R_2}{R_1}\right)V_1$$

$$V_X = \left(1 + \frac{R_2}{R_1}\right)V_1$$

$$V_{R4} = I_{R4}R_4 = \frac{R_4}{R_3}\left(1 + \frac{R_2}{R_1}\right)V_1 - \frac{R_4}{R_3}V_2$$

$$V_{OUT} = V_2 - V_{R4} = V_2 + \frac{R_4}{R_3}V_2 - \frac{R_4}{R_3}\left(1 + \frac{R_2}{R_1}\right)V_1$$

$$V_{OUT} = V_2 - V_{R4} = \left(1 + \frac{R_4}{R_3}\right)V_2 - \frac{R_4}{R_3}\left(1 + \frac{R_2}{R_1}\right)V_1$$

Set $R_4 = R_3$; $R_2 = R_1$ $$\therefore V_{OUT} = 2V_2 - 2V_1 = 2(V_2 - V_1)$$

Where $V_1$ is the capacitor B output (214B), $V_2$ is the capacitor A output (214A), $V_x$ is the output of op amp B (218B), $R_1$ is the resistance of resistor A (220A), $R_2$ is the resistance of resistor B (220B), $R_3$ is the resistance of resistor C (220C), $R_4$ is the resistance of resistor D (220D), $I_{R3}$ is the current across resistor C (220C), $I_{R4}$ is the current across resistor D (220D), $VR_2$ is the voltage across resistor B (220B), and $V_{out}$ is the voltage on the analog unit output (222). Setting each resistor (resistor A (220A), resistor B (220B), resistor C (220C), resistor D (220D)) equal to each other resistor may aid in matching within the fabrication process. Changing the ratio between R3 and R4 to R2 and R1 may result in a change of the output multiplier (e.g., from two times the voltage difference to three times the voltage difference).

As an example, assume that the circuit (200) receives two sets of data results: data A consisting of '1011010111' and data B consisting of '0010010000'. Assume further that the circuit (200) is configured to place units of charge of 0.1V for each positive data point received on the data inputs (i.e., the first unit of charge is equal to the second unit of charge is equal to 0.1V.) Further, assume that each capacitor is provided a baseline charge of 0.3V. After ten clock cycles during which data A is applied to the circuit via data A input (204A) and data B is applied to the circuit via data B input (204B), the charge stored on capacitor A (212A) would be 1.0V, which is 0.3V plus seven units of charge of 0.1V each. The charge stored on capacitor B (212B) would be 0.5V, which is 0.3V plus two units of charge of 0.1V each. The analog unit output (222) may then output a charge of 0.5V (1.0V minus 0.5V).

The sense amp (224) compares the voltage on the analog unit output (222) to a charge threshold inputted on sense amp reference input (226). The sense amp (224) outputs, on the circuit output (228), an indication whether the analog unit output (222) exceeds the charge threshold on the sense amp reference input (226). The sense amps may be any circuit or device able to detect whether a voltage threshold has been crossed. The signals on the circuit output (228) may be detected and read, for example, by a circuit controller.

The analog unit (216) may be configured to evaluate capacitor A output (214A) minus capacitor B output (214B), but may not measure a difference in which capacitor B output (214B) exceeds capacitor A output (214A). In other words, the analog unit (216) may not measure negative results of capacitor A output (214A) minus capacitor B output (214B). In order to evaluate capacitor B output (214B) minus capacitor A output (214A), an additional circuit may be necessary. Alternatively, the same circuit may be employed with the data inputs inverted.

The charge threshold on the sense amp reference input (226) may be calculated in terms of a statistically significant threshold number of units of charge, which if exceeded, indicates that the number of positive data points applied to data A input (204A) differs from the number of the positive data points applied to the data B input (204B) to a statistical significance. The charge threshold on the sense amp reference input (226) may be calculated as a function of the first unit of charge, the second unit of charge, the ratio of the positive data points in the first set of data results to the positive data points in the second set of data results, a probability range and a confidence level. The charge threshold indicates a maximum voltage within which the ratio of the number positive data points in the first set of data results on the data A input (204A) to the number of positive data points in the second set of data results on data B input (204B) are determined to be less than the statistical significance. Exceeding the charge threshold indicates that the ratio of positive data points in the first set of data results to the number of positive data points in the second set of data points is greater than a statistical significance.

Statistical significance is a threshold ratio of positive data points in the first set of data results to positive data points in the second set of data results which mathematically indicates a degree of certainty that positive data points in the first set of data results and positive data points in the second set of data results are not equiprobable. A statistically significant difference between positive data points in the first set of data results and positive data points in the second set of data results indicates a degree of certainty that positive data points in one set of data results occur more frequently than positive data points in the other set of data results, accounting for the order in which the data results are received. This is translated electrically into the circuit as the sense amp reference input.

To determine how many units of charge indicate a statistically significant difference, a probability range is selected based on system requirements, technical considerations, technical specifications, or other factors. A tolerance of unusual events or confidence level is also determined. The tolerance may vary depending on such factors as technical specifications and risk tolerance, but 1%, 5%, and 10% are common. For a given positive value, R, the probability (p) may be set to R/(R+1). Here R is the threshold value compared to the ratio of positive data points in the first set of data results to the positive data point in the second set of data results. For a given probability range (from 'p0'≤≤'p'<'p1') and a confidence level ('alpha' and 'beta'), the following formula may be used to determine a statistically significant number of units of charge that would indicate statistical significance (where 'n' is the total number of positive data points in the sets A and B of data results, and 'y' is the number of positive data points in the first set of data results):

$$\ln(B) < an + by < \ln(A), \text{ where}$$
$$a = \ln\left(\frac{1-p1}{1-p0}\right), \quad b = \ln\left(\frac{p1}{p0}\right) - a, \quad A = \frac{1-\text{beta}}{\text{alpha}}, \text{ and}$$
$$B = \frac{\text{beta}}{1-\text{alpha}}.$$

Taking R=1, p=1/(1+1)=0.5 and using a probability range of p0=0.45≤p=0.5<p1=0.55, and a confidence level of 'alpha' equal to 5% or 0.05 and 'beta' equal to 5% or 0.05, the results of the formula are as follows:

−14.7<y−(n−y)<14.7,

Note that (n−y) is precisely the number of positive data points in set B of data results. Therefore, in this example, if one sets the first unit of charge equal to the second unit of charge, then a difference of 15 units of charge may be selected as indicating a statistically significant difference between positive data points in the first set of data results on the data A input (204A) and positive data points in the second set of data results on the data B input (204B). If data A input (204A) has received 15 more positive data points than data B input (204B), an indication is made that there exists a statistically significant difference between the sets of data results. This formula may be used to calculate a statistically significant number of units of charge regardless of the number of data points anticipated to be received.

Within the circuit, the sense amp reference input (226) may be set to the statistically significant number of units of charge (e.g., 15 units of charge) and compared, by the sense amp (224), to the analog unit output (222). If the voltage on the analog unit output (222) exceeds the statistically significant number of units of charge, then an indication is made on the circuit output (228) that the statistically significant number of units of charge has been exceeded.

As an example, assume that the unit of charge used for the circuit (200) is 0.1V. Assume also that data A input (204A) has received 250 positive data points over 500 clock cycles and data B input (204B) has received 225 positive data points over the same 500 clock cycles. As a result, the charge on capacitor A (212A) would be 25.0V and the charge on capacitor B (212B) would be 22.5V (ignoring any baseline charge). Capacitor A output (214A) would place 25.0V into an input of differential amp A (218A) and capacitor B output (214B) would place 22.5V into an input of differential amp B (218B). A voltage of 2.5V would be generated on analog unit output (222) (25.0V minus 22.5V). Assume that the sense amp reference input (226) has been configured with a statistically significant number of units of charge of 15 units of charge, which would be 1.5V. The sense amp (224) would compare the analog unit output (222) of 2.5V to the sense amp reference input (226) of 1.5V, and output, on the circuit output (228) an indication that the voltage on the analog unit output (222) exceeds the voltage on the sense amp reference input (225). The indication may be in the form of a positive data point, such as a high or '1' signal.

Figure 3:
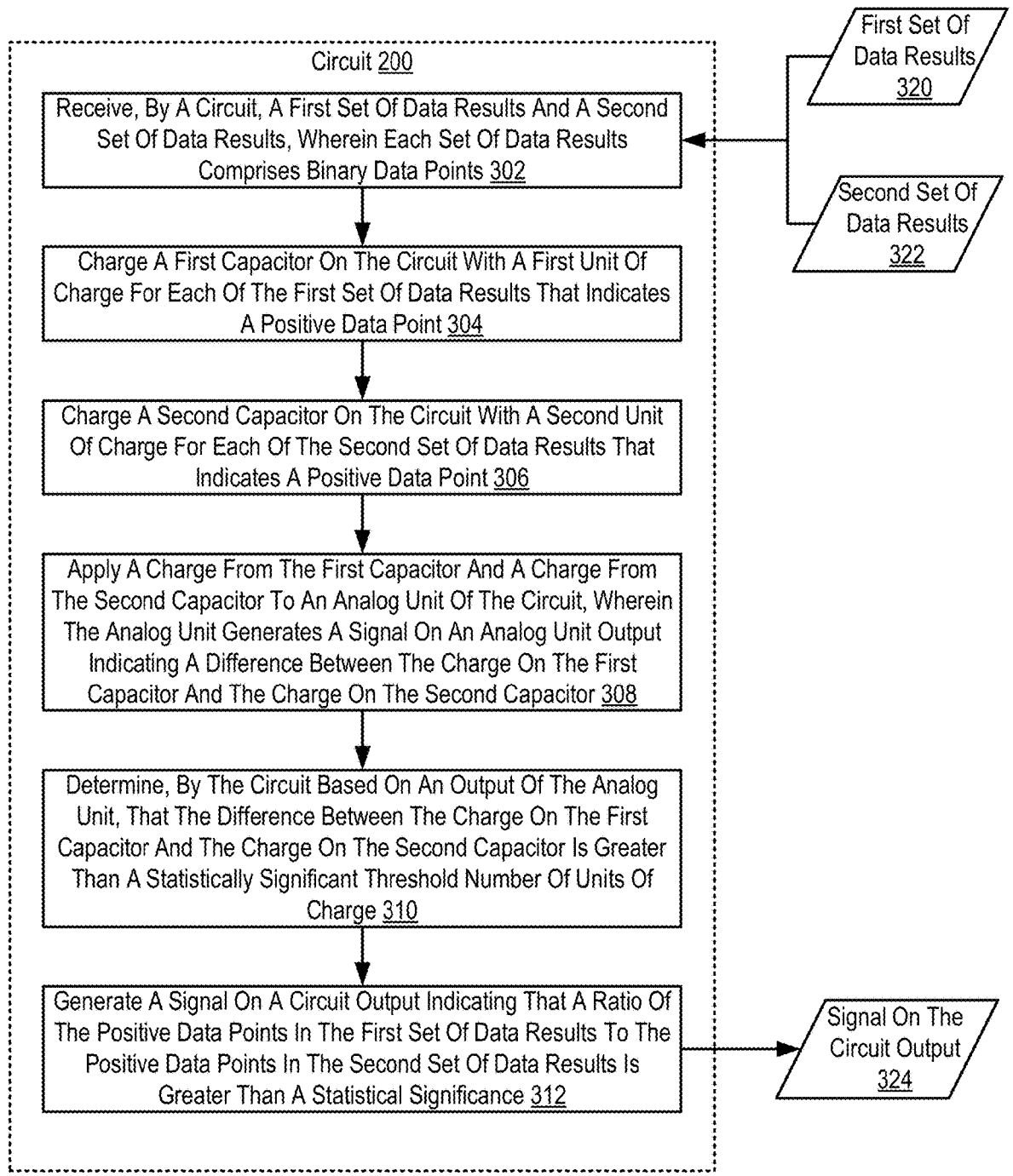
FIG. 3 sets forth a flow chart illustrating an exemplary method for cognitive analysis using applied analog circuits according to embodiments of the present invention.

For further explanation, FIG. 3 sets forth a flow chart illustrating an exemplary method for cognitive analysis using applied analog circuits according to embodiments of the present invention that includes receiving (302), by a circuit (200), a first set of data results (320) and a second set of data results (322), wherein each set of data results comprises binary data points. Receiving (302), by a circuit (200), a first set of data results (320) and a second set of data results (322), wherein each set of data results comprises binary data points may be carried out by applying the first set of data results (320) to a first data input of the circuit and the second set of data results (322) to a second data input of the circuit. Each set of data results (first set of data results (320), second set of data results (322)) may indicate a type of relationship between two or more tests performed under the same conditions. Specifically, the positive data points in the first set of data results indicate a first type of relationship between a first test and a second test, and wherein the positive data points in the second set of data results indicate a second type of relationship between the first test and the second test. Further, the first data point in each of the first set of data results and the second set of data results refers to the relationship between different tests performed under the same conditions (e.g., test performed on the same die).

For example, a set of non-yielding dies may undergo tests to determine whether certain circuits within the die match the specification for the die. Test 1 may be to determine whether a resistance for "via1" matches the specification, and test 2 may be to determine whether a resistance for "m1" matches the specification. Given the two tests, there are four types of relationships possible between test 1 and test 2: test 1 fails and test 2 fails (0,0), test 1 fails and test 2 passes (0,1), test 1 passes and test 2 fails (1,0), and test 1 passes and test 2 passes (1,1). For each die, one of the four relationships will result from the results of test 1 and test 2.

Given the four test relationships, data results can be generated. Data result A determines whether "via1" resistance and m1 resistance are both out of spec (i.e., is the test 1/test 2 relationship equal to (0,0)). Data result B determines whether "via1" resistance is out of spec and m1 resistance is in spec (i.e., is the test 1/test 2 relationship equal to (0,1)). Data result C determines whether "via1" resistance is in spec and "m1" resistance is out of spec (i.e., is the test 1/test 2 relationship equal to (1,0)). Data result 4 determines whether "via1" resistance and "m1" resistance are both in spec (i.e., is the test 1/test 2 relationship equal to (1,1)). Data result D may be ignored because the occurrence of both test 1 and test 2 passing may not be relevant to determining relationships between failing tests on non-yielding dies.

For each test1/test2 relationship, each data result will have corresponding results. For the test1/test2 relationship (0,0), data result A will be '1' (positive), data result B will be '0' (negative), data result C will be '0' (negative), and data result D will be '0' (negative). For the test1/test2 relationship (0,1), result A will be '0' (negative), data result B will be '1' (positive), data result C will be '0' (negative), and data result D will be '0' (negative). For the test1/test2 relationship (1,0), data result A will be '0' (negative), data result B will be '0' (negative), data result C will be '1' (positive), and data result D will be '0' (negative). Finally, for the test1/test2 relationship (1,1), data result A will be '0'

(negative), data result B will be '0' (negative), data result C will be '0' (negative), and data result D will be '1' (positive). The above example may be summarized using the following table:

TABLE 1

| Test 1 | Test 2 | Data Result A | Data Result B | Data Result C | Data Result D |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The circuit may be utilized to determine (very quickly and using little power) whether one data result occurs more frequently to a statistically significant degree than another data result (for example, using a ratio (R) equal to 1). To that end, if two tests are performed on each of a set of conditions (e.g., a set of dies or computer chips), six comparisons may be made using the circuit: data result A minus data result B, data result A minus data result C, data result B minus data result A, data result B minus data result C, data result C minus data result A, and data result C minus data result B. Once again, data result D may be ignored because the occurrence of both test 1 and test 2 passing may not be relevant to determining relationships between failing tests on non-yielding dies.

The method of FIG. 3 also includes charging (304) a first capacitor on the circuit (200) with a first unit of charge for each of the first set of data results (320) that indicates a positive data point. Charging (304) a first capacitor on the circuit (200) with a first unit of charge for each of the first set of data results (320) that indicates a positive data point may be carried out by applying the first set of data results (320) to the data A input of the circuit. The first set of data results may be applied to the first capacitor with the clock pulses via a NOR gate and a non-inverting level shifter. Each positive result in the first set of data results causes one unit of charge to be placed on the first capacitor.

The method of FIG. 3 also includes charging (306) a second capacitor on the circuit (200) with a second unit of charge for each of the second set of data results (322) that indicates a positive data point. Charging (306) a second capacitor on the circuit (200) with a second unit of charge for each of the second set of data results (322) that indicates a positive data point may be carried out by applying the second set of data results (322) to the data B input of the circuit. The second set of data results may be applied to the second capacitor with the clock pulses via a NOR gate and a non-inverting level shifter. Each positive result in the second set of data results causes one unit of charge to be placed on the second capacitor.

The units of charge placed on the first capacitor for each of the first set of data results (320) may be equal to the units of charge placed on the second capacitor for each of the second set of data results (322). Alternatively, the units of charge placed on the first capacitor for each of the first set of data results (320) may be different from the units of charge placed on the second capacitor for each of the second set of data results (322). Further, the size of the first capacitor and the second capacitor may be equal or, alternatively, the size of the first capacitor may be different from the size of the second capacitor.

The method of FIG. 3 also includes applying (308) a charge from the first capacitor and a charge from the second capacitor to an analog unit of the circuit, wherein the analog unit generates a signal on an analog unit output indicating a difference between the charge on the first capacitor and the charge on the second capacitor. Applying (308) a charge from the first capacitor and a charge from the second capacitor to an analog unit of the circuit, wherein the analog unit generates a signal on an analog unit output indicating a difference between the charge on the first capacitor and the charge on the second capacitor may be carried out by the charge on the first capacitor being applied to a first differential amp and the charge on the second capacitor being applied to a second differential amp. Based on the output of the two differential amps, the analog unit outputs a charge equivalent to the difference (or multiple of the difference) between the charge on the first capacitor and the charge on the second capacitor.

The method of FIG. 3 also includes determining (310), by the circuit (200) based on an output of the analog unit, that the difference between the charge on the first capacitor and the charge on the second capacitor is greater than a statistically significant threshold number of units of charge. Determining (310), by the circuit (200) based on an output of the analog unit, that the difference between the charge on the first capacitor and the charge on the second capacitor is greater than a statistically significant threshold number of units of charge may be carried out by applying the output of the analog unit to circuitry (such as a sense amp) configured to compare the output of the analog unit to a reference voltage equivalent to a statistically significant threshold number of units of voltage.

The analog unit output may generate a voltage that is a multiple of the difference between the charge on the first capacitor and the charge on the second capacitor. Accordingly, the statistically significant number of units of charge to which the analog unit output is compared may also be adjusted by the same multiplier. For example, the analog unit output may output two times the difference between the charge on the first capacitor and the charge on the second capacitor. If the statistically significant threshold number of units of charge is calculated as 15 units of charge, the analog unit output may be compared to 30 units of charge, which is two times the statistically significant threshold number of units of charge.

The method of FIG. 3 also includes generating (312) a signal on a circuit output (324) indicating that a ratio of the positive data points in the first set of data results (320) to the positive data points in the second set of data results (322) is greater than a statistical significance. Generating (312) a signal on a circuit output (324) indicating that a ratio of the positive data points in the first set of data results (320) to the positive data points in the second set of data results (322) is greater than a statistical significance may be carried out by circuitry (such as a sense amp) generating a signal in response to the determination that the analog unit output is greater than a voltage equivalent of the statistically significant number of units of charge. The signal may be binary, such as a high or '1' signal on the circuit output (324).

A positive signal on the circuit output (324) indicates that a ratio of the positive data points in the first set of data results (320) to the positive data points in the second set of data results (322) is greater than a statistical significance, and a negative signal on the circuit output (324) indicates that the positive data points in the first set of data results (320) are not greater than the positive data points in the second set of data results (322) to a statistical significance.

For example, the first set of data results (320) may include 105 positive data points and the second set of data results (322) may include 100 positive data results. Assuming the calculated statistically significant positive data points is 15 (i.e., the statistically significant number of units of charge is 15 units of charge), the circuit (200) would determine that the positive data points (105 positive data points) in the first set of data results (320) are not greater than the positive data points (100 positive data points) in the second set of data results (322) to a statistical significance (15 positive data points).

As another example, the first set of data results (320) may include 125 positive data points and the second set of data results (322) may include 100 positive data results. Assuming the calculated statistically significant positive data points is 15 (i.e., the statistically significant number of units of charge is 15 units of charge), the circuit (200) would determine that the positive data points (125 positive data points) in the first set of data results (320) are greater than the positive data points (100 positive data points) in the second set of data results (322) to a statistical significance (15 positive data points).

Based on the signal on the circuit output, a circuit controller may raise a notification or alarm indicating that the two sets of data results are not equiprobable. In response to the notification, steps may be taken to address the source of the anomalous behavior. For example, a manufacturing process may be altered in response to a determination that one test failure relationship occurs more frequently than another test failure relationship to a statistical significance.

Figure 4:
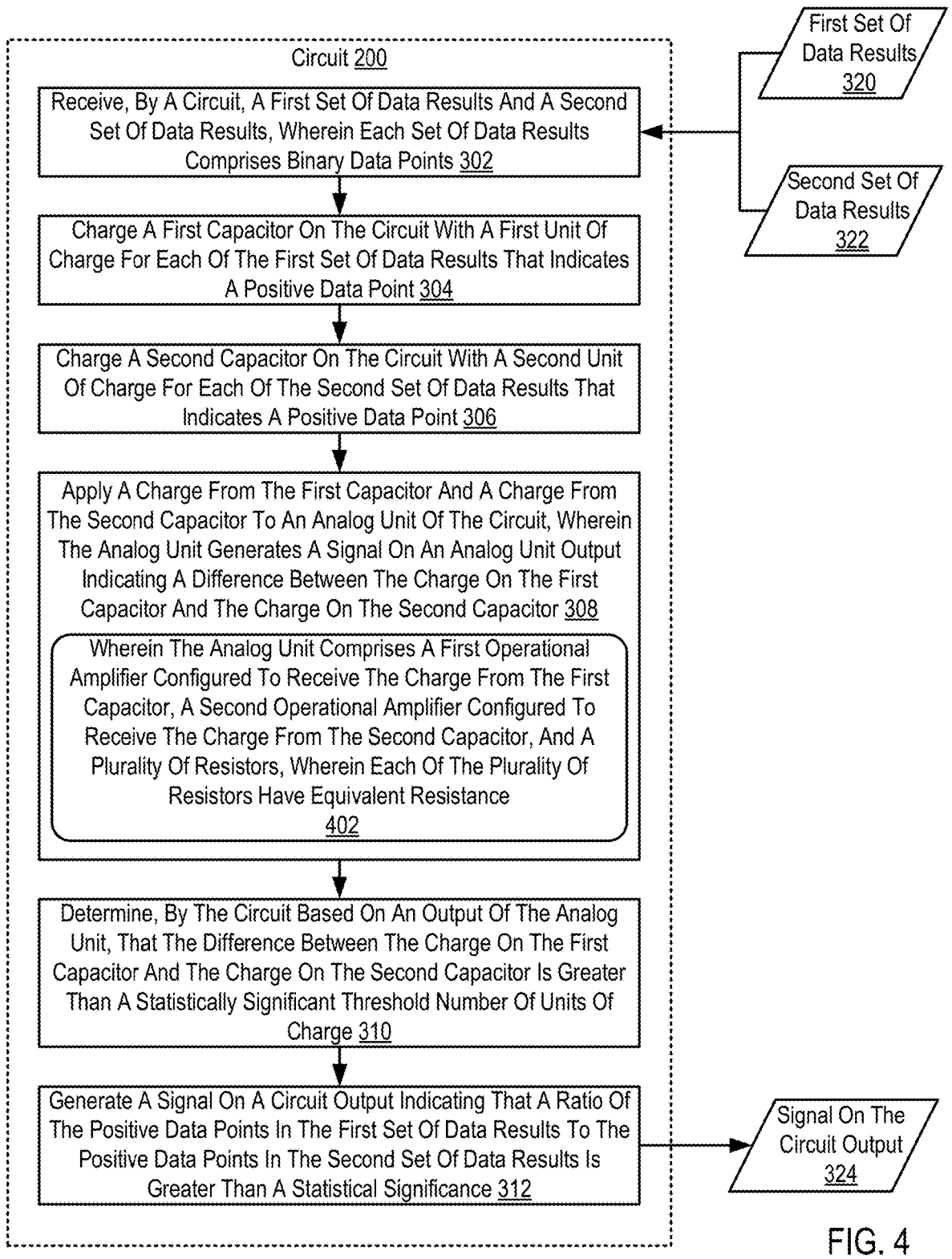
FIG. 4 sets forth a flow chart illustrating an exemplary method for cognitive analysis using applied analog circuits according to embodiments of the present invention.

For further explanation, FIG. 4 sets forth a flow chart illustrating a further exemplary method for cognitive analysis using applied analog circuits according to embodiments of the present invention that includes receiving (302), by a circuit (200), a first set of data results (320) and a second set of data results (322), wherein each set of data results comprises binary data points; charging (304) a first capacitor on the circuit (200) with a first unit of charge for each of the first set of data results (320) that indicates a positive data point; charging (306) a second capacitor on the circuit (200) with a second unit of charge for each of the second set of data results (322) that indicates a positive data point; applying (308) a charge from the first capacitor and a charge from the second capacitor to an analog unit of the circuit, wherein the analog unit generates a signal on an analog unit output indicating a difference between the charge on the first capacitor and the charge on the second capacitor; determining (310), by the circuit (200) based on an output of the analog unit, that the difference between the charge on the first capacitor and the charge on the second capacitor is greater than a statistically significant threshold number of units of charge; and generating (312) a signal on a circuit output (324) indicating that a ratio of the positive data points in the first set of data results (320) to the positive data points in the second set of data results (322) is greater than a statistical significance.

The method of FIG. 4 differs from the method of FIG. 3, however, in that applying (308) a charge from the first capacitor and a charge from the second capacitor to an analog unit of the circuit, wherein the analog unit generates a signal on an analog unit output indicating a difference between the charge on the first capacitor and the charge on the second capacitor includes wherein (402) the analog unit comprises a first differential amplifier configured to receive the charge from the first capacitor, a second differential amplifier configured to receive the charge from the second capacitor, and a plurality of resistors, wherein each of the plurality of resistors have equivalent resistance.

The analog unit may include one, two, or more amplifiers, such as differential amplifiers. The analog unit may also include a number of other components, such as resistors. The resistors may each have an equivalent resistance or there may exist a ratio of resistance between groups of resistors. Each resistor may be equal in resistance to each other resistor in order to aid in matching within a fabrication process. Alternatively, the ratio between groups of resistors may be changed in order to alter an output multiplier (e.g., from two times the voltage difference to three times the voltage difference). The analog unit may include alternative circuitry to accomplish the same analog unit output.

Figure 5:
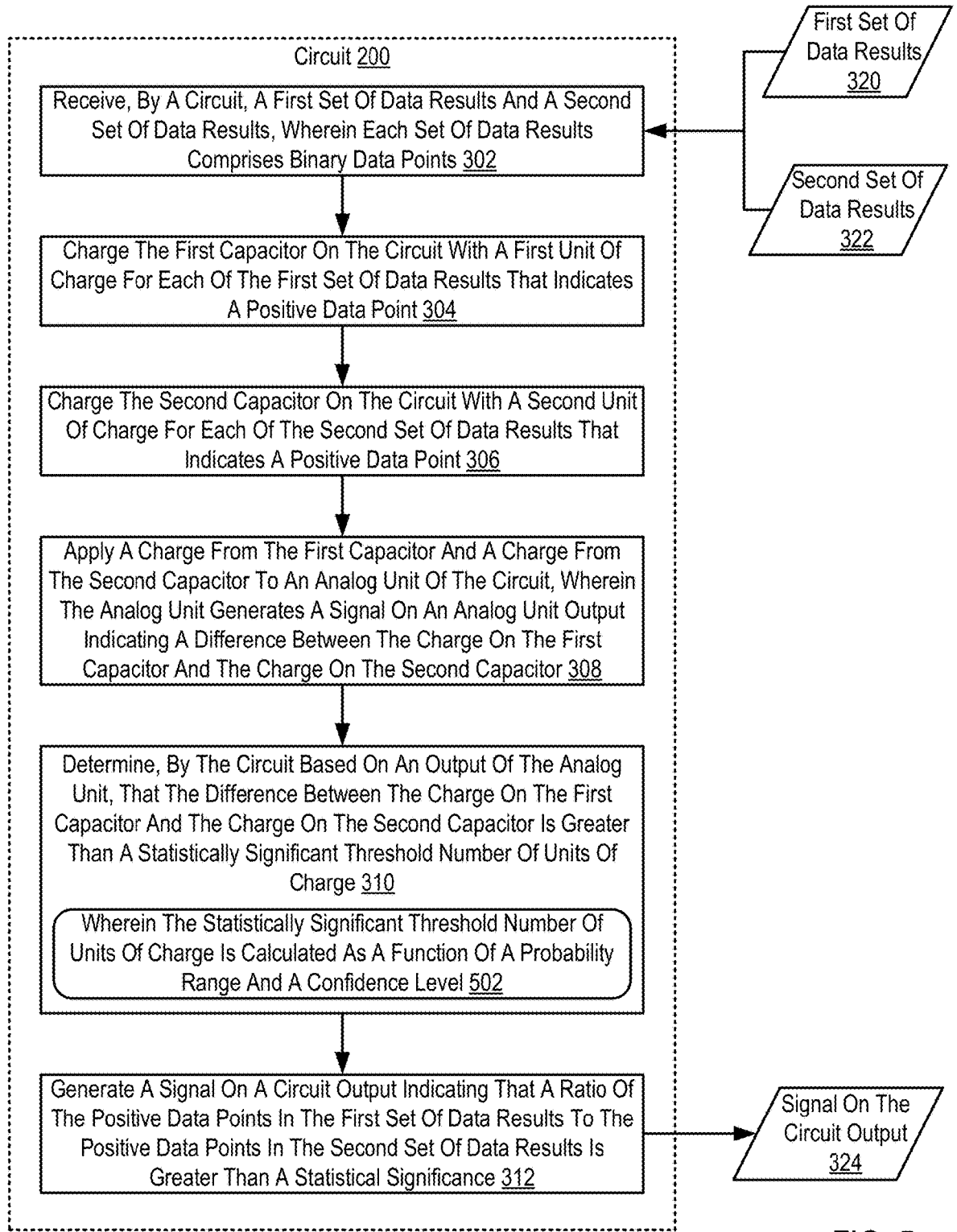
FIG. 5 sets forth a flow chart illustrating an exemplary method for cognitive analysis using applied analog circuits according to embodiments of the present invention.

For further explanation, FIG. 5 sets forth a flow chart illustrating a further exemplary method for cognitive analysis using applied analog circuits according to embodiments of the present invention that includes receiving (302), by a circuit (200), a first set of data results (320) and a second set of data results (322), wherein each set of data results comprises binary data points; charging (304) a first capacitor on the circuit (200) with a first unit of charge for each of the first set of data results (320) that indicates a positive data point; charging (306) a second capacitor on the circuit (200) with a second unit of charge for each of the second set of data results (322) that indicates a positive data point; applying (308) a charge from the first capacitor and a charge from the second capacitor to an analog unit of the circuit, wherein the analog unit generates a signal on an analog unit output indicating a difference between the charge on the first capacitor and the charge on the second capacitor; determining (310), by the circuit (200) based on an output of the analog unit, that the difference between the charge on the first capacitor and the charge on the second capacitor is greater than a statistically significant threshold number of units of charge; and generating (312) a signal on a circuit output (324) indicating that a ratio of the positive data points in the first set of data results (320) to the positive data points in the second set of data results (322) is greater than a statistical significance.

The method of FIG. 5 differs from the method of FIG. 3, however, in that determining (310), by the circuit (200) based on an output of the analog unit, that the difference between the charge on the first capacitor and the charge on the second capacitor is greater than a statistically significant threshold number of units of charge includes wherein (502) the statistically significant threshold number of units of charge is calculated as a function of a probability range and a confidence level. Based on the targeted probability range and targeted confidence level, a statistically significant threshold number of units of charge may be calculated using a variety of methods, including the formulas discussed in reference to FIG. 2. A threshold reference input voltage may then be calculated using the statistically significant number of units of charge and the voltage per unit of charge.

Figure 6:
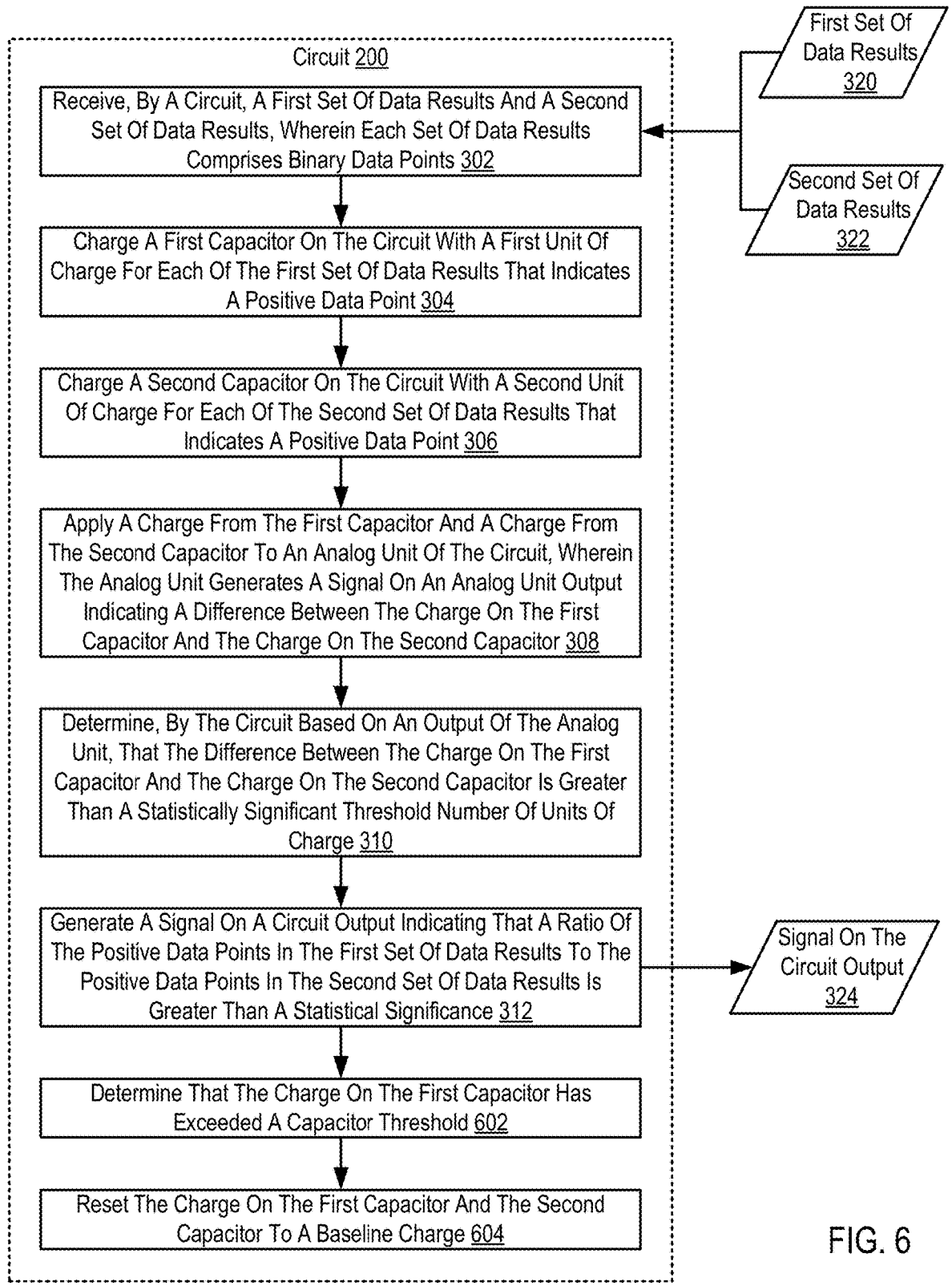
FIG. 6 sets forth a flow chart illustrating an exemplary method for cognitive analysis using applied analog circuits according to embodiments of the present invention.

For further explanation, FIG. 6 sets forth a flow chart illustrating a further exemplary method for cognitive analysis using applied analog circuits according to embodiments of the present invention that includes receiving (302), by a circuit (200), a first set of data results (320) and a second set of data results (322), wherein each set of data results comprises binary data points; charging (304) a first capacitor on the circuit (200) with a first unit of charge for each of the first set of data results (320) that indicates a positive data point; charging (306) a second capacitor on the circuit (200) with a second unit of charge for each of the second set of data results (322) that indicates a positive data point; applying (308) a charge from the first capacitor and a charge from the second capacitor to an analog unit of the circuit, wherein the analog unit generates a signal on an analog unit output indicating a difference between the charge on the first capacitor and the charge on the second capacitor; determining (310), by the circuit (200) based on an output of the analog unit, that the difference between the charge on the first capacitor and the charge on the second capacitor is greater than a statistically significant threshold number of units of charge; and generating (312) a signal on a circuit output (324) indicating that a ratio of the positive data points in the first set of data results (320) to the positive data points in the second set of data results (322) is greater than a statistical significance.

The method of FIG. 6 differs from the method of FIG. 3, however, in that the method of FIG. 6 further includes determining (602) that the charge on the first capacitor has exceeded a capacitor threshold; and resetting (604) the charge on the first capacitor and the second capacitor to a baseline charge. Determining (602) that the charge on the first capacitor has exceeded a capacitor threshold may be carried out by obtaining the current charge on the first capacitor and comparing the current charge on the first capacitor to a capacitor threshold. The capacitor threshold may be less than a maximum charge that the first capacitor can hold. Rather, the capacitor threshold may be the maximum charge within a liner region of the first capacitor such that any additional units of charge will cause a different amount of charge to be placed on the first capacitor than the amount of charge placed on the first capacitor by previously applied units of charge.

Resetting (604) the charge on the first capacitor and the second capacitor to a baseline charge may be carried out by discharging the first capacitor and the second capacitor such that each capacitor has no charge. Each capacitor may then have a baseline charge applied. The baseline charge may be placed on the capacitors to ensure that an output is triggered in the event of a very low number of positive data points. The baseline charge may also ensure that each unit of charge is applied uniformly to the capacitors and that each capacitor maintains a linear region for accepting unites of charge.

In view of the explanations set forth above, readers will recognize that the benefits of cognitive analysis using applied analog circuits according to embodiments of the present invention include:

Utilizing custom circuits to perform near-real-time analysis of test results that is orders of magnitude more efficient than traditional methods and requires less time.

Utilizing custom circuits to quickly and efficiently evaluate large amounts of data to approximate trends and flag anomalies, increasing data evaluation efficiency.

Utilizing custom circuits to quickly and efficiently flag statistically significant differences in received data results without requiring knowledge of the total number of samples.

Utilizing custom circuits to simultaneously detect statistically significant differences using analog circuitry, increasing data evaluation efficiency.

Exemplary embodiments of the present invention are described largely in the context of a fully functional computer system for cognitive analysis using applied analog circuits. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for cognitive analysis using applied analog circuits, the apparatus comprising a circuit configured to carry out the steps of:
   receiving, by a circuit, a first set of data results and a second set of data results, wherein each set of data results comprises binary data points;
   charging a first capacitor on the circuit with a first unit of charge for each of the first set of data results that indicates a positive data point;
   charging a second capacitor on the circuit with a second unit of charge for each of the second set of data results that indicates a positive data point;
   applying a charge from the first capacitor and a charge from the second capacitor to an analog unit of the circuit, wherein the analog unit generates a signal on an analog unit output indicating a difference between the charge on the first capacitor and the charge on the second capacitor;
   determining, by the circuit based on the analog unit output, that the difference between the charge on the first capacitor and the charge on the second capacitor is greater than a threshold number of units of charge; and
   generating a signal on a circuit output indicating that a ratio of the positive data points in the first set of data results to the positive data points in the second set of data results indicates a degree of certainty that positive data points in one set of data results occur more frequently than positive data points in the other set of data results, wherein the signal on the circuit output is at least based on the analog unit output.

2. The apparatus of claim 1, wherein the analog unit comprises:
   a first differential amplifier configured to receive the charge from the first capacitor; and
   a second differential amplifier configured to receive the charge from the second capacitor.

3. The apparatus of claim 2, wherein the analog unit further comprises a plurality of resistors, wherein each of the plurality of resistors have equivalent resistance.

4. The apparatus of claim 1, wherein the statistically significant threshold number of units of charge is calculated as a function of a ratio, a probability range, and a confidence level.

5. The apparatus of claim 1, wherein the first capacitor and the second capacitor are charged to a baseline charge before being charged with the units of charge.

6. The apparatus of claim 1, the circuit further configured to carry out the steps of:
   determining that the charge on the first capacitor has exceeded a capacitor threshold; and
   resetting the charge on the first capacitor and the second capacitor to a baseline charge.

7. The apparatus of claim 1, wherein the positive data points in the first set of data results indicate a first type of relationship between a first test result and a second test result, and wherein the positive data points in the second set of data results indicate a second type of relationship between the first test result and the second test result.

8. A computer program product for cognitive analysis using applied analog circuits, the computer program product disposed upon a computer readable medium, the computer program product comprising computer program instructions that, when executed, cause a computer to carry out the steps of:

receiving, by a circuit, a first set of data results and a second set of data results, wherein each set of data results comprises binary data points;

charging a first capacitor on the circuit with a first unit of charge for each of the first set of data results that indicates a positive data point;

charging a second capacitor on the circuit with a second unit of charge for each of the second set of data results that indicates a positive data point;

applying a charge from the first capacitor and a charge from the second capacitor to an analog unit of the circuit, wherein the analog unit generates a signal on an analog unit output indicating a difference between the charge on the first capacitor and the charge on the second capacitor;

determining, by the circuit based on the analog unit output, that the difference between the charge on the first capacitor and the charge on the second capacitor is greater than a threshold number of units of charge; and generating a signal on a circuit output indicating that a ratio of the positive data points in the first set of data results to the positive data points in the second set of data results indicates a degree of certainty that positive data points in one set of data results occur more frequently than positive data points in the other set of data results, wherein the signal on the circuit output is at least based on the analog unit output.

9. The computer program product of claim 8, wherein the analog unit comprises:
   a first differential amplifier configured to receive the charge from the first capacitor; and
   a second differential amplifier configured to receive the charge from the second capacitor.

10. The computer program product of claim 9, wherein the analog unit further comprises a plurality of resistors, wherein each of the plurality of resistors have equivalent resistance.

11. The computer program product of claim 8, wherein the statistically significant threshold number of units of charge is calculated as a function of a ratio, a probability range, and a confidence level.

12. The computer program product of claim 8, wherein the first capacitor and the second capacitor are charged to a baseline charge before being charged with the units of charge.

13. The computer program product of claim 8, wherein the computer program instructions, when executed, further cause a computer to carry out the steps of:
   determining that the charge on the first capacitor has exceeded a capacitor threshold; and
   resetting the charge on the first capacitor and the second capacitor to a baseline charge.

* * * * *